(12) United States Patent
Uchibe

(10) Patent No.: US 12,178,007 B2
(45) Date of Patent: Dec. 24, 2024

(54) COOLING APPARATUS AND SEMICONDUCTOR APPARATUS WITH COOLING APPARATUS

(71) Applicant: FUJI ELECTRIC CO., LTD., Kawasaki (JP)

(72) Inventor: Ginji Uchibe, Tokyo (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 187 days.

(21) Appl. No.: 17/701,213

(22) Filed: Mar. 22, 2022

(65) Prior Publication Data

US 2022/0377939 A1 Nov. 24, 2022

(30) Foreign Application Priority Data

May 20, 2021 (JP) ................................ 2021-085041

(51) Int. Cl.
*H05K 7/20* (2006.01)
*H01L 23/473* (2006.01)
*H01L 25/11* (2006.01)

(52) U.S. Cl.
CPC ....... *H05K 7/20254* (2013.01); *H01L 23/473* (2013.01); *H01L 25/115* (2013.01)

(58) Field of Classification Search
CPC .......................... H05K 7/20254; H01L 23/473
See application file for complete search history.

(56) References Cited

U.S. PATENT DOCUMENTS

| 3,524,497 A | * | 8/1970 | Chu ...................... H01L 23/473 |
| | | | 174/15.1 |
| 5,763,950 A | * | 6/1998 | Fujisaki .............. H01L 23/3672 |
| | | | 257/E29.022 |
| 6,360,814 B1 | | 3/2002 | Tanaka et al. |
| 7,290,598 B2 | * | 11/2007 | Hanin ...................... F28F 1/10 |
| | | | 165/181 |

(Continued)

FOREIGN PATENT DOCUMENTS

| DE | 102016222629 A1 * | 5/2018 | ........... H01L 23/473 |
| DE | 102016222630 A1 * | 5/2018 | .............. F28F 13/12 |

(Continued)

OTHER PUBLICATIONS

Notice of Reasons for Refusal, dated Aug. 17, 2021, in corresponding Japanese Application No. 2021-085041 (15 pp., including full machine translation).

*Primary Examiner* — Robert J Hoffberg

(57) ABSTRACT

A cooling apparatus includes: a first member including a first surface in contact with a cooling target, a second surface opposite to the first surface, and radiating fins protruding from the second surface; and a second member including a third surface facing the second surface, a refrigerant flows between the first member and the second member, the second member includes a first protrusion protruding from the third surface toward a space, the space existing between the radiating fins in a flow direction of the refrigerant, the first protrusion includes a first slope inclined to the third surface, the first slope includes a first end and a second end, the first end is closer to the second surface than the second end, the second end is closer to the third surface than the first end, the first end is positioned downstream in the flow direction from the second end.

11 Claims, 11 Drawing Sheets

(56) References Cited

U.S. PATENT DOCUMENTS

| | | | |
|---|---|---|---|
| 7,578,337 B2* | 8/2009 | Spokoiny | F28F 3/022 165/80.4 |
| 7,588,074 B1* | 9/2009 | White | F28F 3/083 257/722 |
| 8,125,078 B2* | 2/2012 | Yoshida | H01L 23/473 257/712 |
| 8,331,092 B2* | 12/2012 | Kawaura | H01L 23/473 361/717 |
| 8,537,548 B2* | 9/2013 | Bhattacharya | G06F 1/20 361/710 |
| 9,111,911 B2* | 8/2015 | Niimi | H01L 23/473 |
| 9,158,349 B2* | 10/2015 | Dean | H01L 23/34 |
| 10,178,805 B2* | 1/2019 | Ramm | F28F 3/022 |
| 10,756,001 B2* | 8/2020 | Kitamura | H01L 23/473 |
| 11,011,453 B2* | 5/2021 | Arai | H05K 7/20254 |
| 2006/0067051 A1* | 3/2006 | Ku | H01L 23/467 257/E23.099 |
| 2009/0114372 A1* | 5/2009 | Ippoushi | F28F 3/12 165/104.19 |
| 2010/0090336 A1 | 4/2010 | Yoshida et al. | |
| 2011/0067841 A1* | 3/2011 | Doo | H05K 7/20254 165/104.19 |
| 2011/0108247 A1 | 5/2011 | Kawaura et al. | |
| 2012/0033382 A1* | 2/2012 | Tsunoda | H01L 23/473 165/104.31 |
| 2012/0211214 A1* | 8/2012 | Phan | H01L 23/3677 165/185 |
| 2019/0148265 A1* | 5/2019 | Kitamura | H01L 23/3735 257/714 |
| 2023/0044486 A1* | 2/2023 | Hanano | H01L 23/473 |
| 2023/0077047 A1* | 3/2023 | Nishikawa | H01L 23/473 |
| 2023/0298967 A1* | 9/2023 | Hori | H01L 23/473 361/699 |

FOREIGN PATENT DOCUMENTS

| | | | | |
|---|---|---|---|---|
| DE | 102018209586 A1 | * | 12/2019 | ........... H01L 23/473 |
| JP | 2001077257 A | | 3/2001 | |
| JP | 2003324173 A | * | 11/2003 | ........... H01L 23/473 |
| JP | 2005032881 A | | 2/2005 | |
| JP | 2008-172014 A | | 7/2008 | |
| JP | 2011108683 A | | 6/2011 | |
| JP | 2020035998 A | | 3/2020 | |
| WO | 2018116653 A1 | | 6/2018 | |

\* cited by examiner

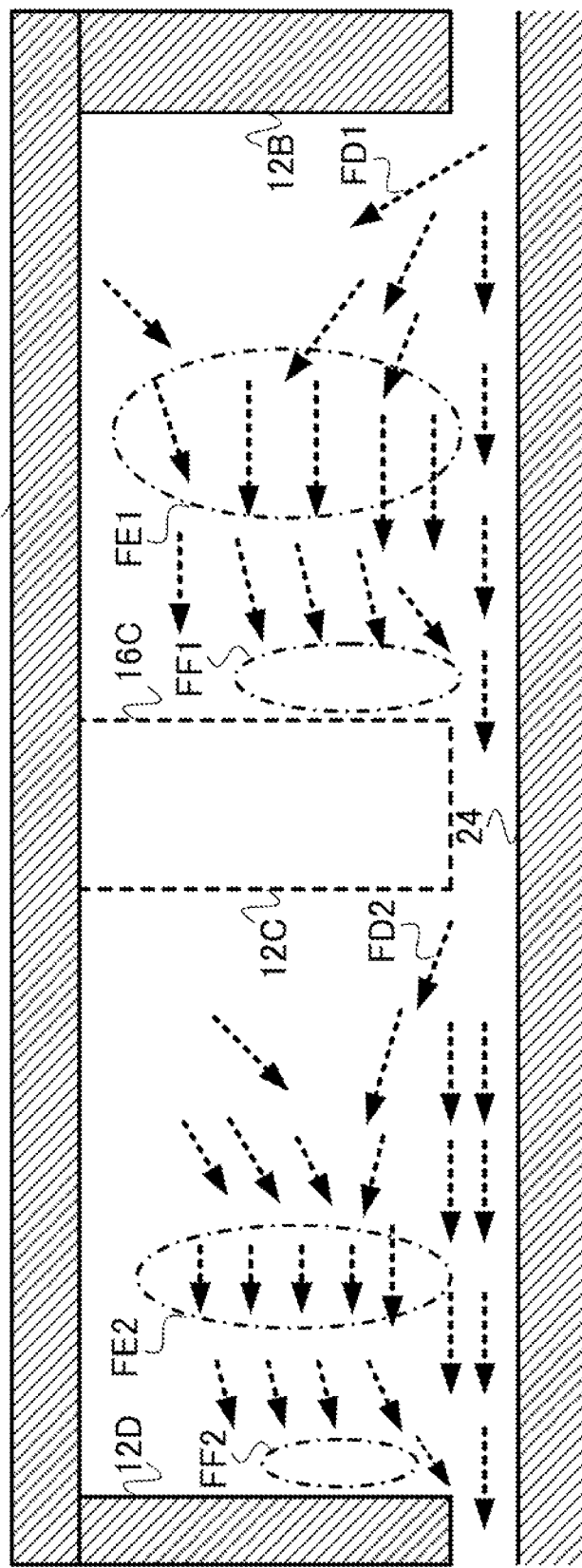
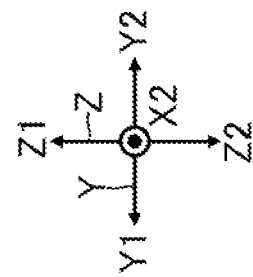
FIG. 7
COMPARATIVE EXAMPLE

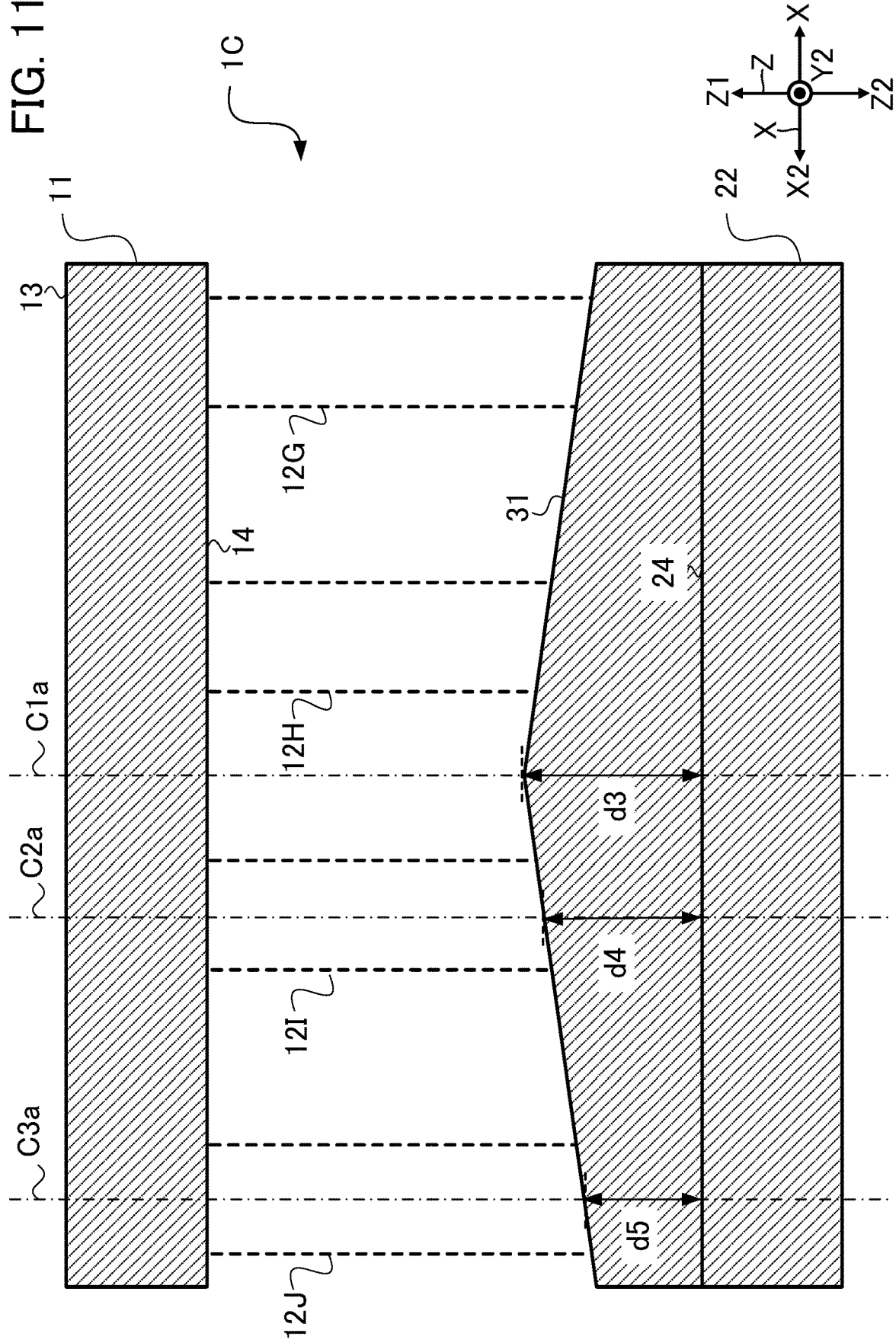

US 12,178,007 B2

COOLING APPARATUS AND SEMICONDUCTOR APPARATUS WITH COOLING APPARATUS

CROSS REFERENCE TO RELATED APPLICATION

This application is based on, and claims priority from, Japanese Patent Application No. 2021-085041, filed May 20, 2021, the entire content of which is incorporated herein by reference.

BACKGROUND

Technical Field

The disclosure relates to a cooling apparatus and to a semiconductor apparatus with the cooling apparatus.

Related Art

Japanese Patent Applications Laid-Open Publications Nos. 2008-172014 and 2011-108683 each disclose a cooling apparatus for causing a semiconductor to radiate heat to cool the semiconductor. The cooling apparatus is in contact with a semiconductor and a refrigerant flows through the cooling apparatus. There is known a technique for enhancing cooling performance of such a cooling apparatus. In the technique, such a cooling apparatus includes a plurality of protrusions protruding from a member in contact with a semiconductor toward a flow path of a refrigerant.

Japanese Patent Application Laid-Open Publication No. 2020-35998 discloses a cooler in which a plurality of cooling fins and a water jacket are not integrated with each other, that is, it is an open-type cooler. This cooler includes a refrigerant flowing path configured by a combination of a heat sink and a path component. This cooler includes a plurality of fins, each protruding from the heat sink toward the path component. The path component includes an inner wall surface with both a first portion and a second portion. The first portion faces the plurality of fins. The second portion is a portion into which a refrigerant enters from outside the refrigerant flowing path. The first portion includes a plurality of recesses. Each of the recesses includes a bottom surface that is farther from a cooling target than the second portion. Each of the fins includes a tip that is farther from the cooling target than the second portion. Each tip is in a space defined by a recess.

Therefore, the cooler disclosed in Japanese Patent Application Laid-Open Publication No. 2020-35998 prevents an increase in a flow rate of a refrigerant, which flows through a gap between the tip of each of the fins and the path component without sufficiently cooling the fins. An object of this cooler is to improve performance of cooling a cooling target by increasing a flow rate of a refrigerant that contributes to cooling the fins.

However, the technique disclosed in Japanese Patent Application Laid-Open Publication No. 2020-35998 causes a decrease in a flow rate of a refrigerant around the tip of each fin. Therefore, the technique causes a decrease in a flow rate of a refrigerant, which has passed through the gap between the tip of a fin and the path component, flowing toward a root of a fin. Consequently, even if there is a sufficient temperature difference between a cooling target and a refrigerant, the cooling target cannot radiate a sufficient amount of heat via the fins.

SUMMARY

An object of this disclosure is to provide a cooling apparatus capable of cooling a cooling target more efficiently than conventional apparatuses, and a semiconductor apparatus with the cooling apparatus.

In one aspect, a cooling apparatus includes: a first member including a first surface in contact with a cooling target, a second surface opposite to the first surface, and a plurality of radiating fins protruding from the second surface; and a second member including a third surface facing the second surface, a refrigerant flows between the first member and the second member, the second member includes a first protrusion protruding from the third surface toward a space, the space existing between the radiating fins in a flow direction of the refrigerant, the first protrusion includes a first slope inclined to the third surface, the first slope includes a first end and a second end, the first end is closer to the second surface than the second end, the second end is closer to the third surface than the first end, and the first end is positioned downstream in the flow direction from the second end.

In another aspect, a semiconductor apparatus includes the cooling apparatus described above.

BRIEF DESCRIPTION OF THE DRAWINGS

FIG. 7 is a diagram illustrating flow of a refrigerant in a cross section of a cooling apparatus 50 according to a comparative example.

FIG. 11 is a cross sectional view of a cooling apparatus 1C according to a modification of the disclosure.

DESCRIPTION OF THE EMBODIMENTS

Cooling apparatuses according to embodiments are described with reference to the drawings. In each drawing, dimensions and scales of elements may be different from those of actual products. The embodiments described below include various technical limitations. The scope of the disclosure is not limited to the embodiments described below.

1. First Embodiment

A cooling apparatus according to a first embodiment will be described below with reference to FIGS. 1 to 8.

1.1 Configuration of First Embodiment

Figure 1:
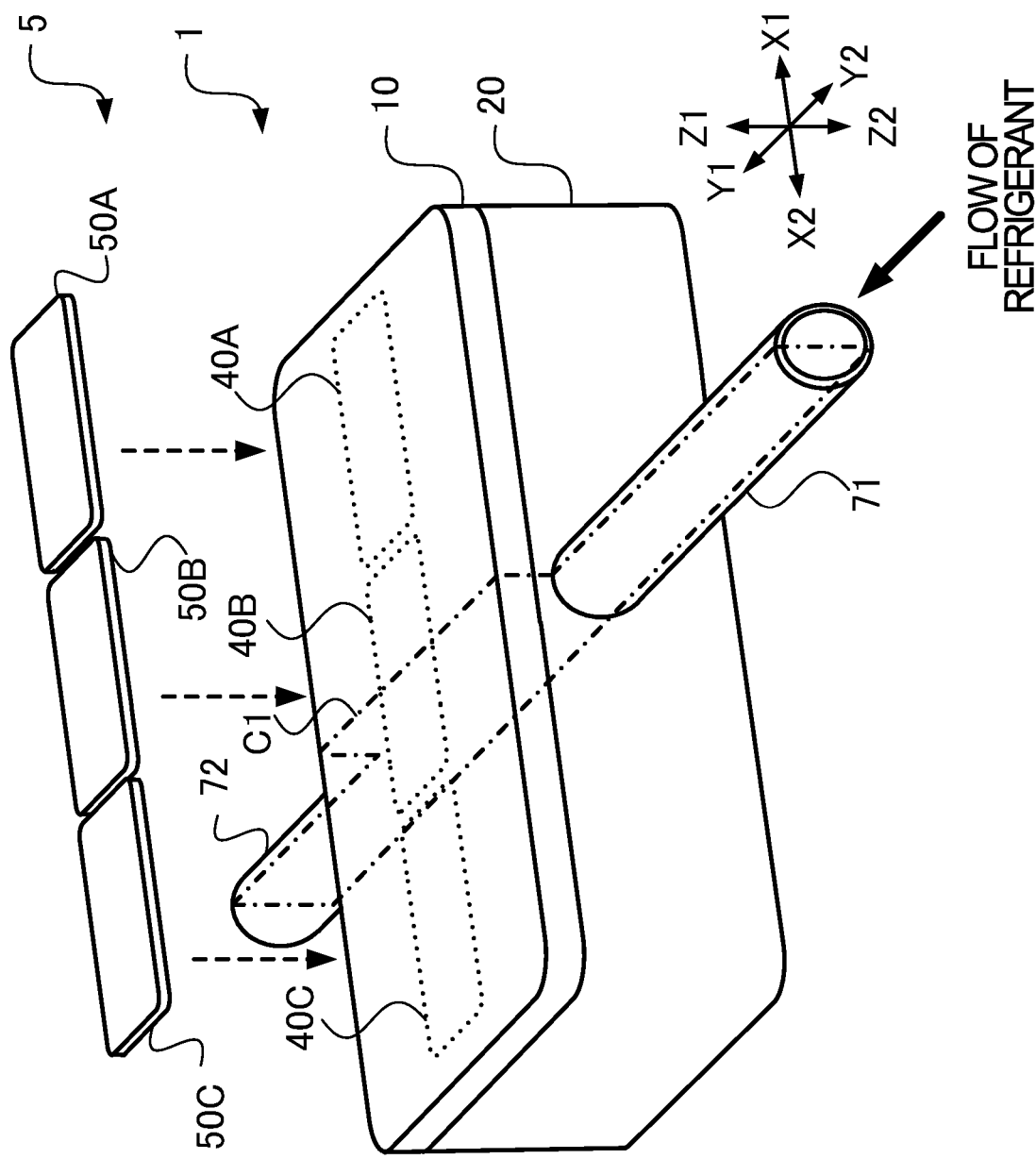
FIG. 1 is a perspective view of a cooling apparatus 1 according to an embodiment of the disclosure.

FIG. 1 is a diagram of both a cooling apparatus 1 according to a first embodiment and a semiconductor apparatus 5 including the cooling apparatus 1. The cooling apparatus 1 includes a heat radiating plate 10 and a water jacket 20. The heat radiating plate 10 is arranged on the water jacket 20. The heat radiating plate 10 may be preferably made of metal, in particular, a metal with a relatively high heat transfer coefficient such as copper or aluminum. A way to arrange the heat radiating plate 10 on the water jacket 20 may be a way to use an adhesive or welding, for example.

In this specification, the heat radiating plate 10 is an example of a "first member". The water jacket 20 is an example of a "second member".

To cool a cooling target in contact with the heat radiating plate 10, a refrigerant that is a liquid with a viscosity flows through the cooling apparatus 1. The water jacket 20 is coupled with a supply pipe 71 for supplying the refrigerant to the cooling apparatus 1. The water jacket 20 is coupled with a drain pipe 72 for draining the refrigerant, which has cooled the cooling target, from the cooling apparatus 1. The refrigerant is supplied to the cooling apparatus 1 by a pump (not illustrated).

In the following description, X, Y, and Z axes are defined. The X, Y, and Z axes are perpendicular to each other. The X, Y, and Z axes are applied to all diagrams used in the following description. As illustrated in FIG. 1, one direction along the X-axis is referred to as an X1 direction, and a direction opposite to the X1 direction is referred to as an X2 direction. The X1 and X2 directions are included in an X-axis direction. The X-axis direction is a direction along the X-axis. Similarly, two directions along the Y-axis are referred as Y1 and Y2 directions. The Y1 and Y2 directions are opposite to each other. The Y1 and Y2 directions are included in a Y-axis direction. The Y-axis direction is a direction along the Y-axis. Two directions along the Z-axis are referred to as Z1 and Z2 directions. The Z1 and Z2 directions are opposite to each other. The Z1 and Z2 directions are included in a Z-axis direction. The Z-axis direction is a direction along the Z-axis.

In FIG. 1, the Y1 direction is a direction in which the refrigerant is supplied to, and drained from, the cooling apparatus 1. The Y1 direction is an example of a flow direction, which is a direction in which the refrigerant flows. When a bottom surface of the water jacket 20 is arranged on a horizontal surface, the X-axis direction is a direction on the horizontal surface, which is perpendicular to the Y-axis. The Z-axis direction, which is perpendicular to the X and Y axes, is a direction in which the heat radiating plate 10 and the water jacket 20 overlap.

The cooling apparatus 1 cools the cooling target. The cooling target is an object to be cooled by the cooling apparatus 1. In the first embodiment, an example of the cooling target is each of semiconductor modules 50A to 50C. "Semiconductor module" means a module including a resin case housing a semiconductor element. The semiconductor element is, or includes, for example, a semiconductor chip including a switching element, such as an Insulated Gate Bipolar Transistor (IGBT) and a Metal Oxide Semiconductor Field Effect Transistor (MOSFET). The semiconductor apparatus 5 includes the cooling apparatus 1 and the semiconductor modules 50A to 50C. The three semiconductor modules 50A to 50C are in contact with three regions 40A to 40C, respectively. The regions 40A to 40C are included in the heat radiating plate 10. In other words, the semiconductor modules 50A to 50C are in contact with the heat radiating plate 10. The refrigerant is supplied to the water jacket 20 via the supply pipe 71. The supplied refrigerant cools the semiconductor modules 50A to 50C in contact with the regions 40A to 40C, respectively. The refrigerant, which has cooled the semiconductor modules 50A to 50C, is drained in the Y1 direction from the water jacket 20 via the drain pipe 72.

Figure 2:
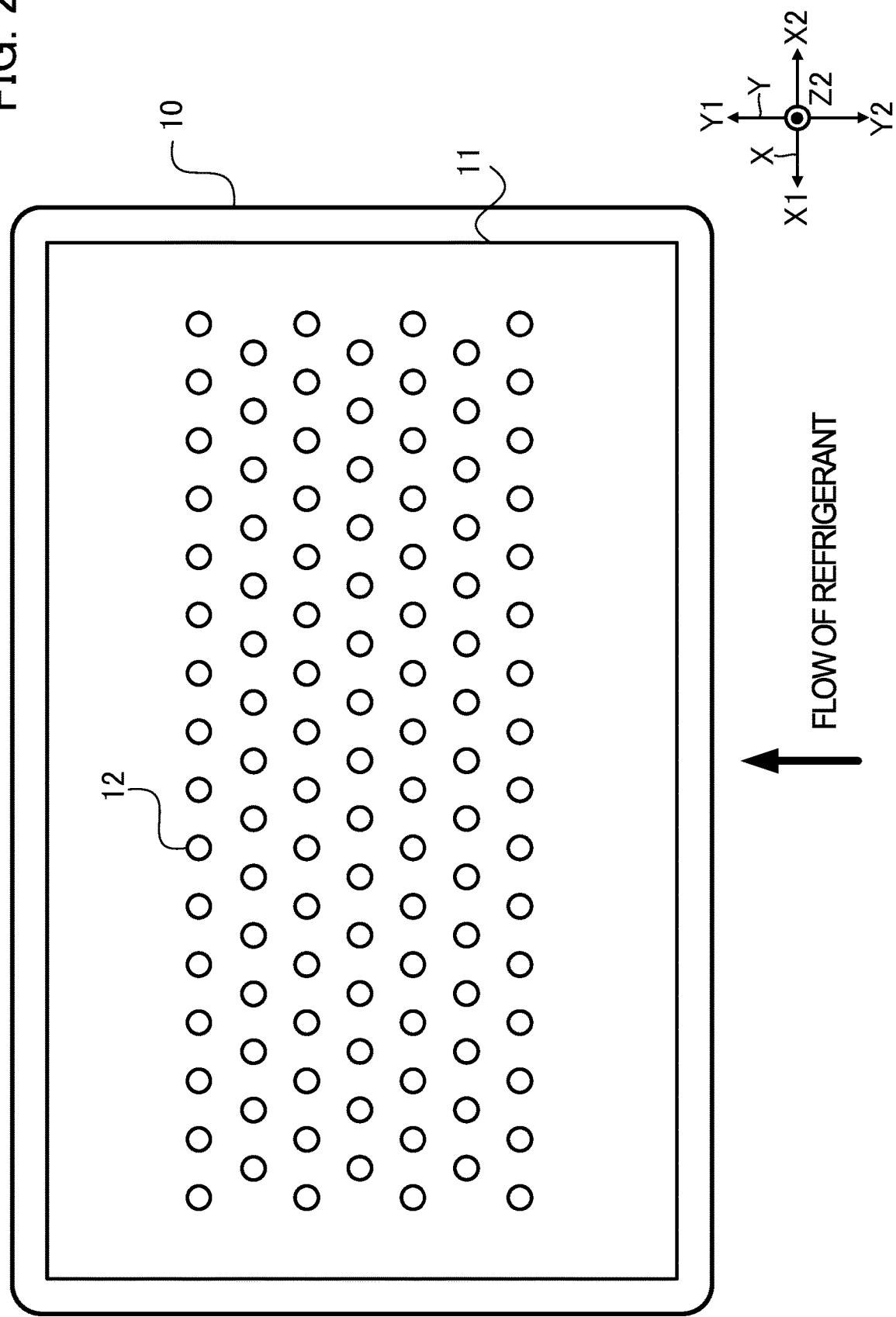
FIG. 2 is a plan view of a heat radiating plate 10 included in the cooling apparatus 1.
Figure 3:
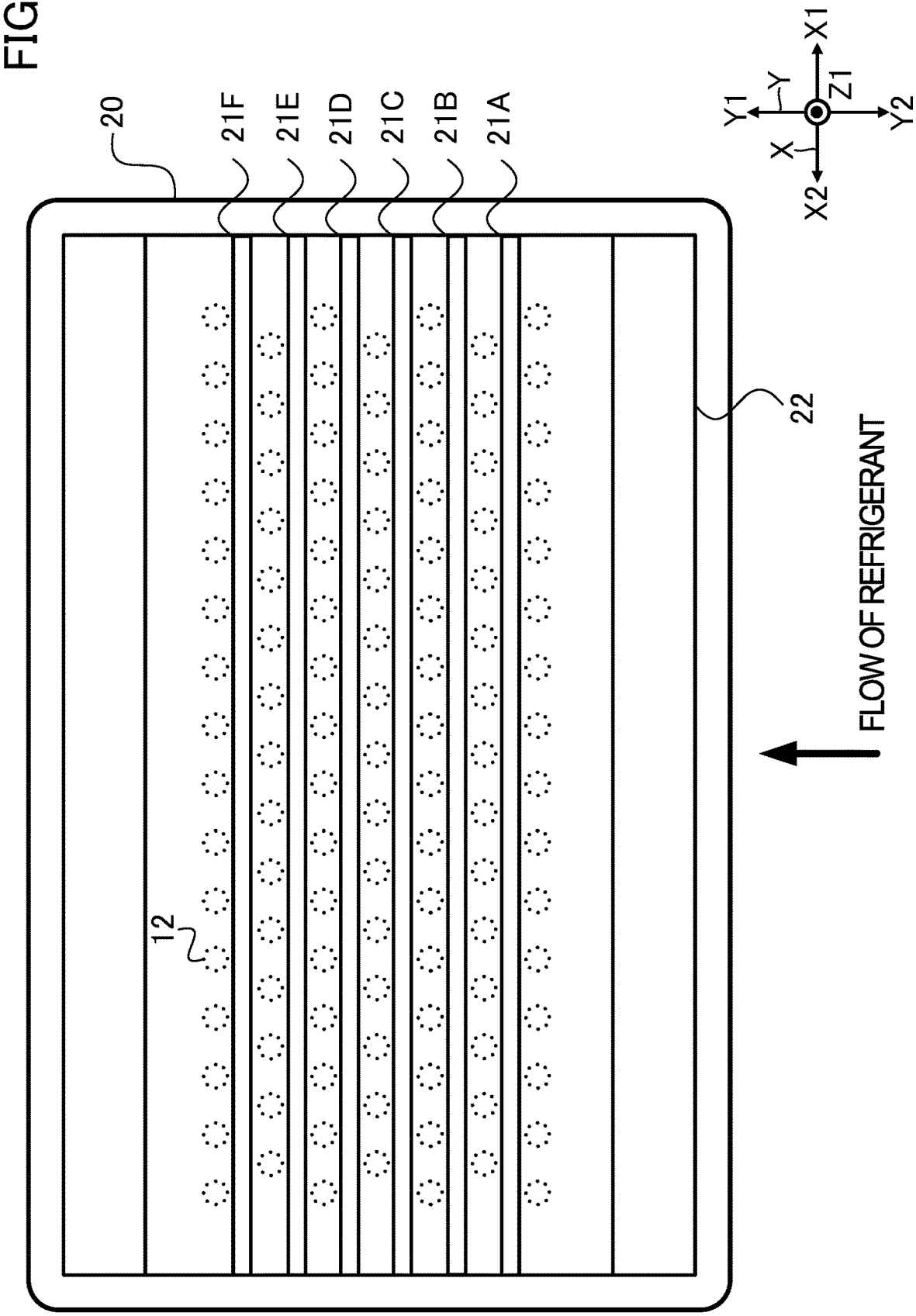
FIG. 3 is a plan view of a water jacket 20 included in the cooling apparatus 1.
Figure 4:
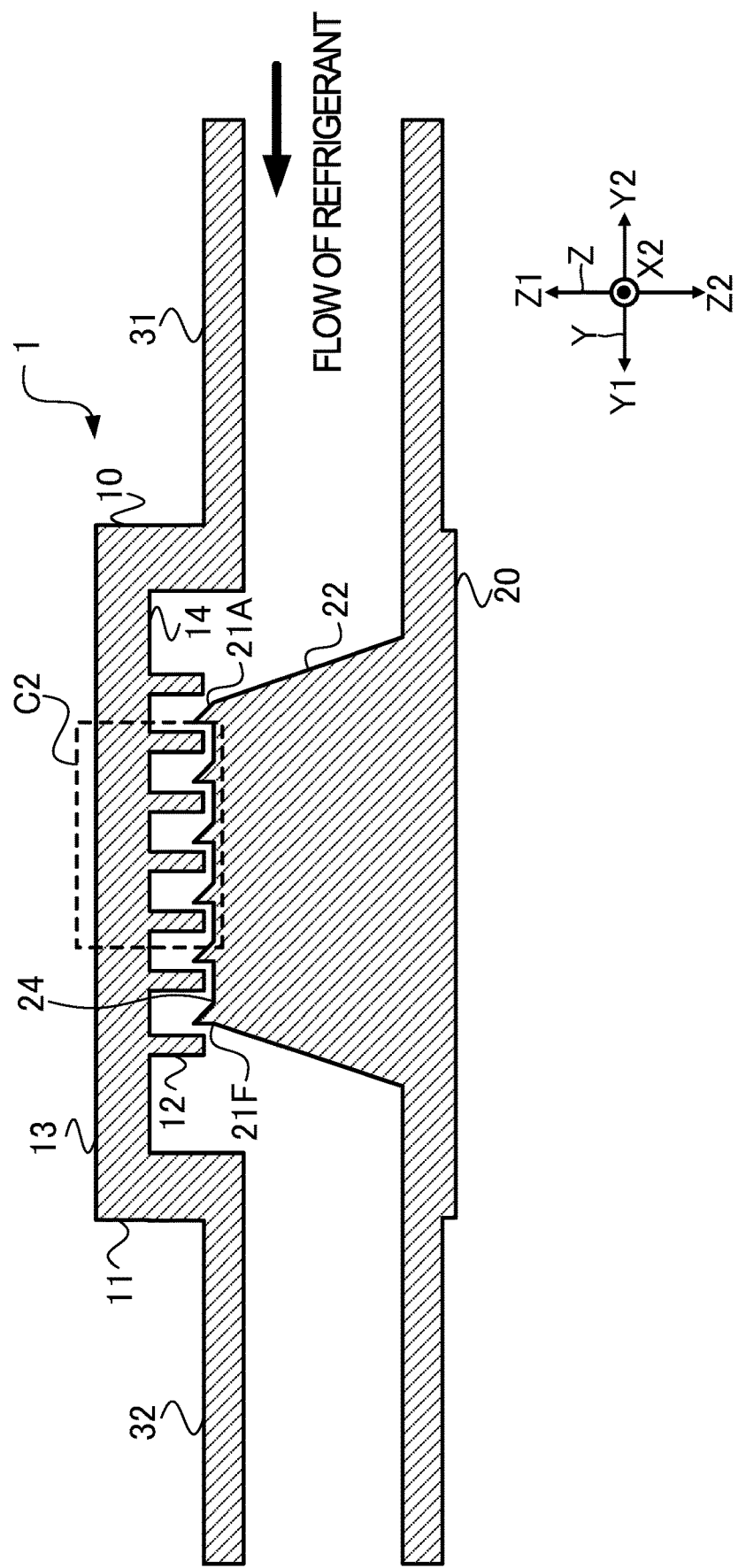
FIG. 4 is a cross sectional view of the cooling apparatus 1.

FIG. 2 is a plan view of the heat radiating plate 10 when viewed from the Z1 direction. FIG. 3 is a plan view of the water jacket 20 when viewed from the Z2 direction. FIG. 4 is a cross sectional view illustrating the cooling apparatus 1, the supply pipe 71, and the drain pipe 72 in a cross section C1 in FIG. 1.

As illustrated in FIGS. 2 and 4, the heat radiating plate 10 includes a first base plate 11 and a plurality of pin fins 12.

The first base plate 11 is a plate-shaped member on which each cooling target is arranged. The first base plate 11 is a flat plate-shaped member including an arranging surface 13 and a heat radiating surface 14. The arranging surface 13 and the heat radiating surface 14 is each a plane parallel to an X-Y plane. The arranging surface 13 is a surface opposite to the heat radiating surface 14. The heat radiating surface 14 is a surface opposite to the arranging surface 13. The arranging surface 13 is an example of a "first surface." The heat radiating surface 14 is an example of a "second surface."

The cooling targets are arranged on the arranging surface 13. The arranging surface 13 includes the rectangular-shaped regions 40A to 40C spaced apart from each other in the X1 direction. The respective cooling targets are arranged on the respective regions 40. In other words, the cooling targets are arranged in the X1 direction on the arranging surface 13. Each cooling target is fixed to the arranging surface 13 with, for example, an adhesive.

As described above, the first base plate 11 may preferably be a flat plate parallel to the X-Y plane, but not limited to this aspect. For example, the arranging surface 13 of the first base plate 11 may be processed in accordance with a shape of the cooling target to be arranged on the arranging surface 13. The heat radiating surface 14 of the first base plate 11 may include a slope, or the heat radiating surface 14 may be a curved surface.

The plurality of pin fins 12 are portions for radiating heat from each cooling target in contact with the arranging surface 13. The plurality of pin fins 12 are spaced apart from each other on the heat radiating surface 14. Each pin fin 12 is a columnar protrusion protruding in the Z2 direction from the heat radiating surface 14. As illustrated in FIG. 4, each pin fin 12 may preferably not be in contact with the water jacket 20. Each pin fin 12 may be bonded or welded to the first base plate 11. Alternatively, the first base plate 11 and the pin fins 12 may be formed integrally with a mold.

Each pin fin 12 is a member for transferring heat, which is conducted from the cooling targets via the first base plate 11, to the refrigerant. Specifically, the heat generated in the cooling targets is conducted from the arranging surface 13 via the inside of the first base plate 11 to the heat radiating surface 14 in the Z2 direction, and it is then conducted from the first base plate 11 to each pin fin 12. The heat reaching each pin fin 12 is conducted from a root of each pin fin 12 to a tip of each pin fin 12 in the Z2 direction.

As illustrated in FIG. 2, the plurality of pin fins 12 are divided into a plurality of rows. Each of the rows is a set of two or more pin fins 12 arranged spaced apart from each other along the X-axis. The rows are arranged spaced apart from each other in the Y-axis direction.

The pin fins 12 in each row may be preferably equally spaced from each other in the X-axis direction. However, the embodiment is not limited to this aspect. The pin fins 12 in each row may be unequally spaced from each other in the X-axis direction.

As illustrated in FIG. 2, the pin fins 12 may be preferably staggered on the first base plate 11. "Staggered" means an arrangement in which pin fins 12 included in one row of the rows are alternated with pin fins 12 included in a row adjacent to the one row when viewed from the Y1 direction.

The pin fins 12 are staggered on the first base plate 11. Therefore, after the refrigerant flowing in the Y1 direction passes through a space between two pin fins 12 included in one row, the refrigerant comes into contact with a front surface of another pin fin 12 immediately. Therefore, it is possible to radiate large amounts of heat from the pin fins 12.

When a situation, in which the pin fins 12 are staggered on the first base plate 11, is viewed from the Y1 direction, one pin fin 12 included in one row of the rows may be preferably positioned at a midpoint between two pin fins 12, which are next to each other in the X-axis direction, included in a row adjacent to the one row. However, the embodiment is not limited to this aspect. For example, when viewed from the Y1 direction, the one pin fin 12 included in the one row may be positioned at a place different from the midpoint between the two pin fins 12, which are next to each other in the X-axis direction, included in the row adjacent to the one row.

In this specification, the pin fin 12 is an example of a "radiating fin."

As illustrated in FIGS. 3 and 4, the water jacket 20 includes protrusions 21A to 21F and a second base plate 22. The second base plate 22 includes a facing surface 24 as a surface facing the heat radiating surface 14 of the first base plate 11. The facing surface 24 is a plane parallel to the X-Y plane. The facing surface 24 is an example of a "third surface." A space between the heat radiating surface 14 and the facing surface 24 is a flow path of a refrigerant. As illustrated in FIG. 4, the second base plate 22 may include a protrusion protruding in the Z1 direction.

The water jacket 20 may preferably be made of a metal, in particular, a metal with a relatively high heat transfer coefficient such as copper and aluminum.

The protrusions 21A to 21F and the second base plate 22 may be formed integrally with a mold. A way to form the protrusions 21A to 21F and the second base plate 22 is not limited to a way to integrally form the protrusions 21A to 21F and the second base plate 22. The protrusions 21A to 21F may be joined to the second base plate 22 by bonding or by welding.

As described above, in the water jacket 20, the facing surface 24 of the second base plate 22 may be preferably spaced apart from a tip of each pin fin 12 protruding in the Z2 direction. On the other hand, when the cooling apparatus 1 is manufactured in a state in which the tip of each pin fin 12 protruding in the Z2 direction is in contact with the second base plate 22 or in a state in which the tip of each pin fin 12 protruding in the Z2 direction and the second base plate 22 are integrated, it is necessary to reduce their dimensional tolerances compared with a configuration in which the tip of each pin fin 12 protruding in the Z2 direction is apart from the second base plate 22. A configuration with reduced dimensional tolerance increases manufacturing cost of the cooling apparatus 1. In the embodiment, a space is present between the tip of each pin fin 12 protruding in the Z2 direction and the second base plate 22. Therefore, compared to the configuration in which the tip of each pin fin 12 protruding in the Z2 direction is in contact with the second base plate 22, dimensional tolerance can be increased. Consequently, manufacturing cost is reduced. However, the embodiment is not limited to this aspect. For example, the tip of each pin fin 12 protruding in the Z2 direction may be in contact with the second base plate 22. The tip of each pin fin 12 protruding in the Z2 direction and the second base plate 22 may be integrated.

In FIG. 3, dotted lines represent images of the plurality of pin fins 12 projected onto the second base plate 22 in the Z2 direction. The protrusions 21A to 21F are arranged on the facing surface 24. The protrusions 21A to 21F are arranged between the pin fins 12 in the flow direction of the refrigerant. Specifically, each of the protrusions 21A to 21F protrudes in the Z1 direction from the facing surface 24 of the second base plate 22 toward a space. The space exists between the pin fins 12 in the flow direction of the refrigerant. Each of the protrusions 21A to 21F is an example of a "first protrusion." Each of the protrusions 21A to 21E may be an example of a "second protrusion" instead of an example of the "first protrusion." The second protrusion is positioned upstream in the flow direction from the first protrusion of the refrigerant. Each of the protrusions 21A to 21F extends linearly in the X1 direction over an entire width of the facing surface 24. Focusing on the rows obtained by dividing the pin fins 12, in plan view, one protrusion 21 is arranged between adjacent rows in the Y1 direction.

The protrusions 21A to 21F may preferably extend in the X-axis direction in FIG. 3. However, the embodiment is not limited to this aspect. For example, a plurality of protrusions 21 may be spaced apart from each other in the X-axis direction in FIG. 3. A direction in which the protrusions 21A to 21F extend is not limited to the X-axis direction in FIG. 3 as long as the direction, in which the protrusions 21A to 21F extend, intersects a flow path direction of the refrigerant (the flow direction). "Flow path direction of the refrigerant" corresponds to the Y1 direction.

In FIG. 3, a plurality of protrusions 21A-21F is illustrated, but the embodiment is not limited to this aspect. For example, only one of the protrusions 21A to 21F may be arranged.

Figure 5:
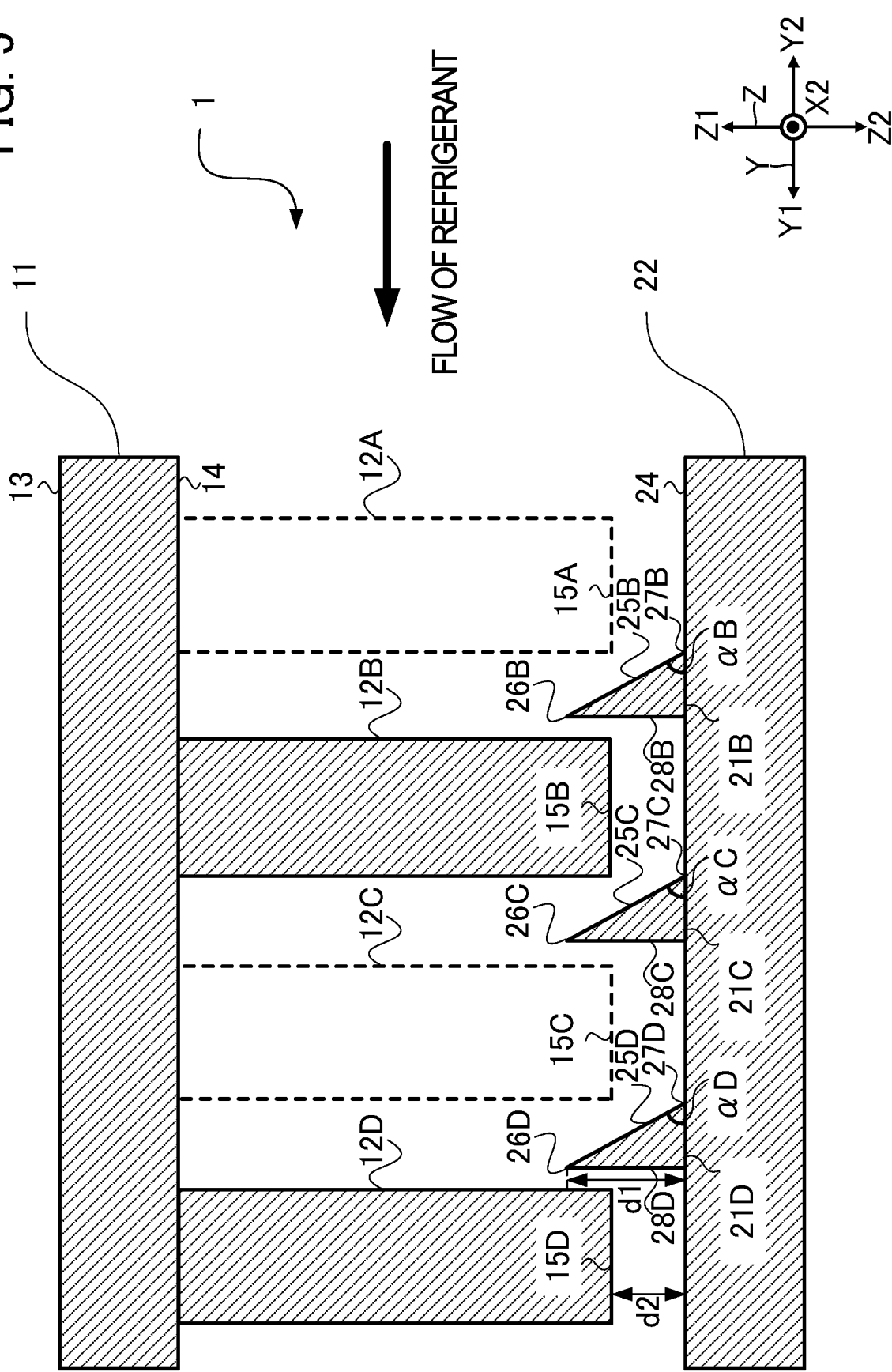
FIG. 5 is a cross sectional view of the cooling apparatus 1.

FIG. 5 is an enlarged view of a region C2 in FIG. 4. In FIG. 5, the positions of the pin fins 12A and 12C are shifted in the X1 direction from the positions of the pin fins 12B and 12D. Therefore, the pin fins 12A and 12C are represented by dotted lines. The protrusion 21B is arranged on the second base plate 22. The protrusion 21B is arranged between the pin fin 12A and the pin fin 12B. Similarly, the protrusion 21C is arranged on the second base plate 22. The protrusion 21C is arranged between the pin fin 12B and pin fin 12C. The protrusion 21D is arranged on the second base plate 22. The protrusion 21D is arranged between the pin fin 12C and the pin fin 12D.

The protrusions 21A to 21F include slopes 25A to 25F, respectively. The slopes 25A to 25F are each inclined to the facing surface 24 of the second base plate 22. Each of the slopes 25A to 25F is an example of a "first slope." Each of the slopes 25A to 25E may be an example of a "second slope" instead of an example of a "first slope." The second slope is included in the second protrusion. The slopes 25A to 25F include tips 26A to 26F, respectively. The tips 26A to 26F are each an example of a "first end." Each of the tips 26A to 26E may be an example of a "third end" instead of an example of a "first end." The slopes 25A to 25F further include ends 27A to 27F, respectively. The ends 27A to 27F are each an example of a "second end." Each of the ends 27A to 27E may be an example of a "fourth end" instead of an example of a "second end." The tips 26A to 26F are closer to the heat radiating surface 14 of the first base plate 11 than the ends 27A to 27F, respectively. The ends 27A to 27F are closer to the facing surface 24 of the second base plate 22 than the tips 26A to 26F, respectively. The tip 26A is positioned downstream in the flow direction of the refrigerant from the end 27A. Similarly, the tips 26B to 26F are positioned downstream in the flow direction Y1 of the refrigerant from the ends 27B to 27F, respectively. A slope angle α between the facing surface 24 and the slope 25 is greater than 0° and less than 90°. In this embodiment, the slopes 25A to 25F are each a plane. A shape of a cross section, which is perpendicular to the X-axis, of each of the protrusions 21A to 21F, is a right triangle. The hypotenuse of the right triangle is impacted by the refrigerant flowing in the flow direction Y1.

The protrusions 21A to 21F each include back surfaces 28A to 28F, respectively, in addition to the slopes 25A to 25F. The back surfaces 28A to 28F are positioned downstream in the flow direction Y1 of the refrigerant from the slopes 25A to 25F, respectively. The back surfaces 28A to 28F are each perpendicular to the facing surface 24.

The tips 26A to 26F of the protrusions 21A to 21F protruding in the Z1 direction are closer to the heat radiating surface 14 than tips 15A to 15F of the pin fins 12A to 12F protruding in the Z2 direction, respectively. In other words, a distance d1 from the facing surface 24 to each of the tips 26A to 26F of the protrusions 21A to 21F is greater than a distance d2 from the facing surface 24 to each of the tips 15A to 15F of the pin fins 12A to 12F.

In FIG. 5, the heights d1 of the protrusions 21B to 21D in the Z-axis direction are equal to each other, but the embodiment is not limited to this aspect. Specifically, the heights d1 of the protrusions 21B to 21D in the Z-axis direction may be different from each other. In particular, the protrusions 21B to 21D may be arranged in ascending order of height d1 along the flow direction Y1 of the refrigerant.

In FIG. 5, the slope angles of the slopes 25B to 25D, that is, the slope angles αB to αD between the slopes 25B to 25D and the facing surface 24 are equal to each other, but the embodiment is not limited to this aspect. Specifically, the slope angles αA to αF of the slopes 25A to 25F are different from each other. In particular, the slope angles αA to αF of the slopes 25A to 25F may be arranged in ascending order of the slope angle along the flow direction Y1 of the refrigerant. Since the cooling apparatus 1 includes such a configuration, as described below, it is possible to reduce difference between degrees to which the refrigerant approaches the roots of the pin fins 12 in a range from an upstream side to a downstream side in the flow direction Y1 of the refrigerant.

In FIG. 5, the positions of the protrusions 21B to 21D on the facing surface 24 in the Y-axis direction are each a position between the pin fins 12 in the flow direction of the refrigerant, and the protrusions 21B to 21D are apart from the pin fins 12. However, the embodiment is not limited to this aspect. For example, the back surfaces 28B to 28D of the protrusions 21B to 21D may be respectively in contact with the pin fins 12B to 12D positioned downstream in the flow direction Y1 of the refrigerant from the protrusions 21B to 21D. Each of the back surfaces 28B to 28D may be in contact with at least one pin fin 12.

Figure 6:
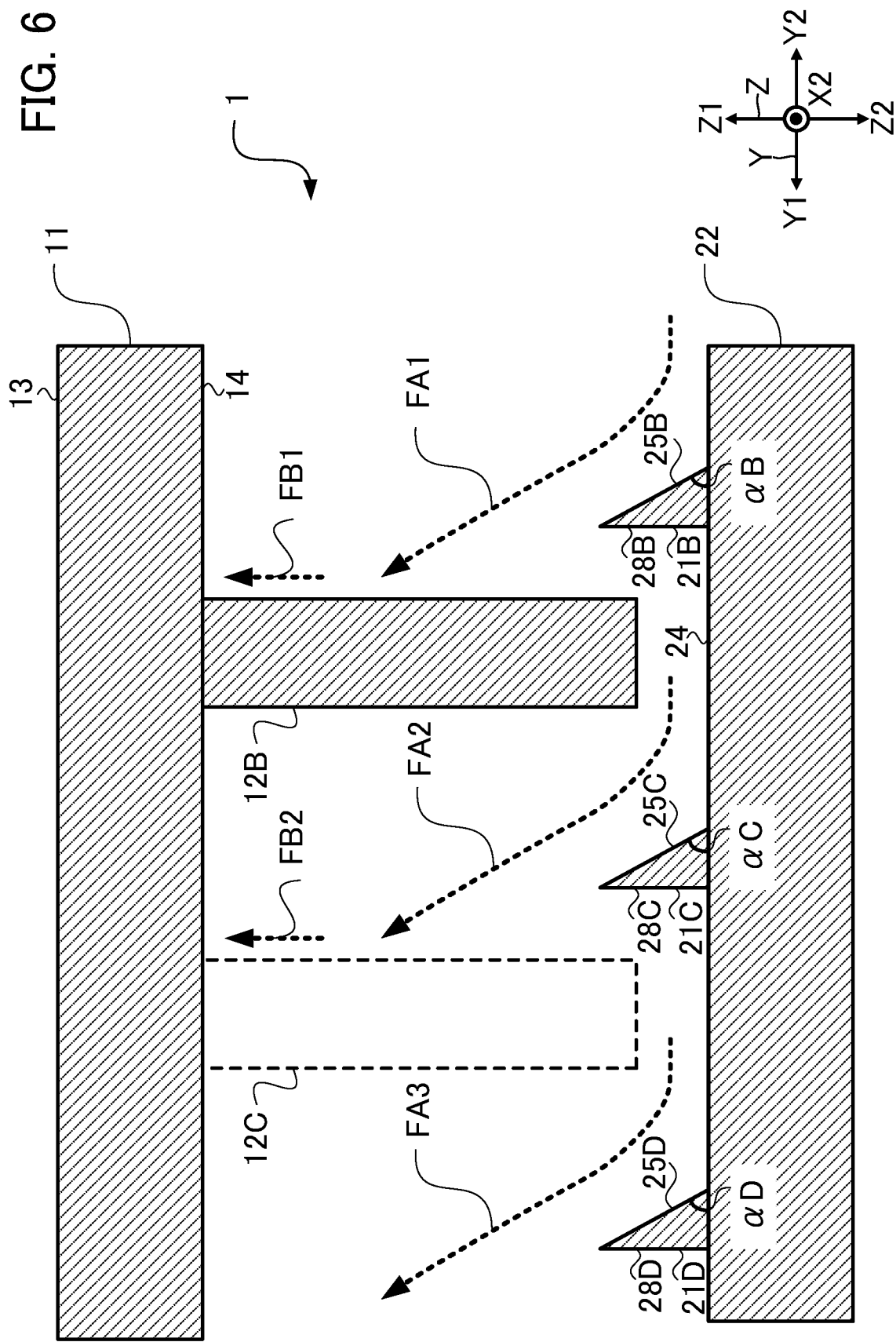
FIG. 6 is a diagram illustrating flow of a refrigerant in a cross section of the cooling apparatus 1.

FIG. 6 is a diagram illustrating a flow of the refrigerant in the region C2. In FIG. 6, each of the arrows shows the flow of the refrigerant. As illustrated by arrow "FA1" in FIG. 6, when the refrigerant flowing in the Y1 direction comes into contact with the slope 25B of the protrusion 21B, the refrigerant moves along the slope 25B. Thereafter, when the refrigerant comes into contact with the pin fin 12B, as illustrated by arrow "FB1" in FIG. 6, the refrigerant flows along the pin fin 12B in the Z1 direction.

Some of the refrigerant that rises along the slope 25B moves along both the back surface 28B of the protrusion 21B and the pin fin 12B in the Z2 direction, and passes through a gap between the pin fin 12B and the facing surface 24 in the Y1 direction. As illustrated by arrow "FA2" in FIG. 6, when the refrigerant, which has passed through the gap between the pin fin 12B and the facing surface 24, comes into contact with the slope 25C of the protrusion 21C, the refrigerant moves along the slope 25C. Thereafter, when the refrigerant comes into contact with the pin fin 12C, as illustrated by arrow "FB2" in FIG. 6, the refrigerant flows along the pin fin 12C in approximately the Z1 direction.

Similarly, some of the refrigerant that rises along the slope 25C moves along both the back surface 28C of the protrusion 21C and the pin fin 12C in the Z2 direction, and passes through a gap between the pin fin 12C and the facing surface 24 in the Y1 direction. As illustrated by arrow "FA3" in FIG. 6, when the refrigerant, which has passed through the gap between the pin fin 12C and the facing surface 24, comes into contact with the slope 25D of the protrusion 21D, the refrigerant moves along the slope 25D.

Therefore, the refrigerant approaches the roots of the pin fins 12B and 12C. Consequently, the cooling target in contact with the arranging surface 13 of the first base plate 11 is efficiently cooled. Specifically, as described above, the heat generated in the cooling target conducts in the Z2 direction inside the first base plate 11 from the arranging surface 13 to the heat radiating surface 14 and then conducts from the first base plate 11 to each pin fin 12. Due to an increase in the flow rate of the refrigerant approaching the root of each pin fin 12, the heat conducted from the cooling target to each pin fin 12 is radiated more efficiently. Therefore, the cooling target is cooled more efficiently.

As the slope angles of the slopes 25A to 25F, that is, the slope angles αA to αF between the slopes 25A to 25F and the facing surface 24 decrease, resistance of the refrigerant flowing between the heat radiating surface 14 and the facing surface 24 decreases. This causes reduction in pressure drop based on difference between pressure of the refrigerant at an inlet of the cooling apparatus 1 and pressure of the refrigerant at an outlet of the cooling apparatus 1. The smaller the pressure drop, the smaller the load to flow the refrigerant into the cooling apparatus 1. Therefore, there is an advantage in reducing the frequency of failure of a pump for supplying refrigerant to the cooling apparatus 1. On the other hand, the greater the slope angles αA to αF of the slopes 25A to 25F, the greater an angle between a direction, in which the refrigerant flows along the slopes 25A to 25F, and the facing surface 24. Therefore, an amount of refrigerant approaching the roots of the pin fins 12 increases. Consequently, there is an advantage in that the cooling target in contact with the arranging surface 13 of the first base plate 11 is cooled more efficiently.

Fluid analysis of four models were carried out. The four models included a model having protrusions each including a slope with a slope angle of 30°, a model having protrusions each including a slope with a slope angle of 45°, a model having protrusions each including a slope with a slope angle of 60°, and a model having protrusions each including a slope with a slope angle of 75°. In the results of fluid analysis, the model with the slope angle of 30° had the smallest pressure drop based on the difference between the pressure of the refrigerant at the inlet of the cooling apparatus 1 and the pressure of the refrigerant at the outlet of the cooling apparatus 1 of the four models. On the other hand, the model with the slope angle of 75° had the greatest amount of refrigerant approaching the roots of the pin fins 12.

FIG. 7 is a diagram illustrating flow of refrigerant in a cooling apparatus 50 that is a first comparative example. For components in common with the cooling apparatus 1 and the cooling apparatus 50, the same reference signs are used, and explanations of their functions are omitted. In FIG. 7, each of arrows shows the flow of refrigerant. The longer the length of the arrow, the higher the flow velocity.

The cooling apparatus 50 differs from the cooling apparatus 1 in that the protrusions 21A to 21F are not arranged. Therefore, for example, after the refrigerant, which has passed through the gap between the pin fins 12B and the facing surface 24, flows into a space between the pin fins 12B and 12C in a direction illustrated by arrow "FD1" in FIG. 7, the refrigerant is not directed in the Z1 direction. Consequently, as illustrated by arrow "FE1" in FIG. 7, the flow of the refrigerant is in approximately the Y-axis direction in a middle region between the pin fins 12B and 12C. The pin fin 12C includes an end 16C facing the pin fin 12B. As illustrated in a region "FF1" in FIG. 7, unlike the cooling apparatus 1, the flow of the refrigerant in the Z1 direction does not occur near the end 16C. Therefore, a flow rate of the refrigerant is reduced in a vicinity of the root of the pin fin 12C. Consequently, an amount of heat exchange between the refrigerant and the cooling target in the cooling apparatus 50 becomes less than that of the cooling apparatus 1.

As illustrated by arrows "FD1" and "FD2" in FIG. 7, a force of the flow of the refrigerant in the Z1 direction, after the refrigerant passes through the gap between the pin fin 12C and the facing surface 24, is weaker than a force of the flow of the refrigerant in the Z1 direction after the refrigerant passes through the gap between the pin fin 12B and the facing surface 24 of the second base plate 22. As illustrated by arrows in respective regions "FE1" and "FE2" in FIG. 7, flow velocity of a downstream refrigerant, that is, flow velocity of a refrigerant in a vicinity of the pin fin 12D is lower than flow velocity of an upstream refrigerant, that is, flow velocity of a refrigerant in a vicinity of the pin fin 12B. A flow rate of the downstream refrigerant is less than a flow rate of the upstream refrigerant. In particular, in a region close to the first base plate 11, flow velocity of the downstream refrigerant is lower than flow velocity of the upstream refrigerant, and the flow rate of the downstream refrigerant is less than the flow rate of the upstream refrigerant. As will be understood from FIG. 4, this is because directing the flow of the refrigerant in the Z1 direction increases as the gap between the pin fin 12 and the facing surface 24 is closer to the supply pipe 71.

Therefore, as described above, in the cooling apparatus 1, the heights of the protrusions 21A to 21F in the Z axial direction, that is, the distances d1 from the facing surface 24 to the tips 26A to 26F may be preferably arranged in ascending order of height in the flow direction Y1 of the refrigerant. In this case, it is possible to reduce difference between degrees to which the refrigerant approaches the roots of the pin fins 12 in the range from the upstream side to the downstream side.

Similarly, with respect to the slope angles αA to αF of the slopes 25A to 25F in the cooling apparatus 1, as the slope 25 is closer to the downstream side of the refrigerant, the slope angle of the slope 25 may be preferably greater. In this case, it is possible to reduce difference between degrees to which the refrigerant approaches the roots of the pin fins 12 in the range from the upstream side in the flow direction Y1 of the refrigerant to the downstream side in the flow direction Y1 of the refrigerant.

Figure 8:
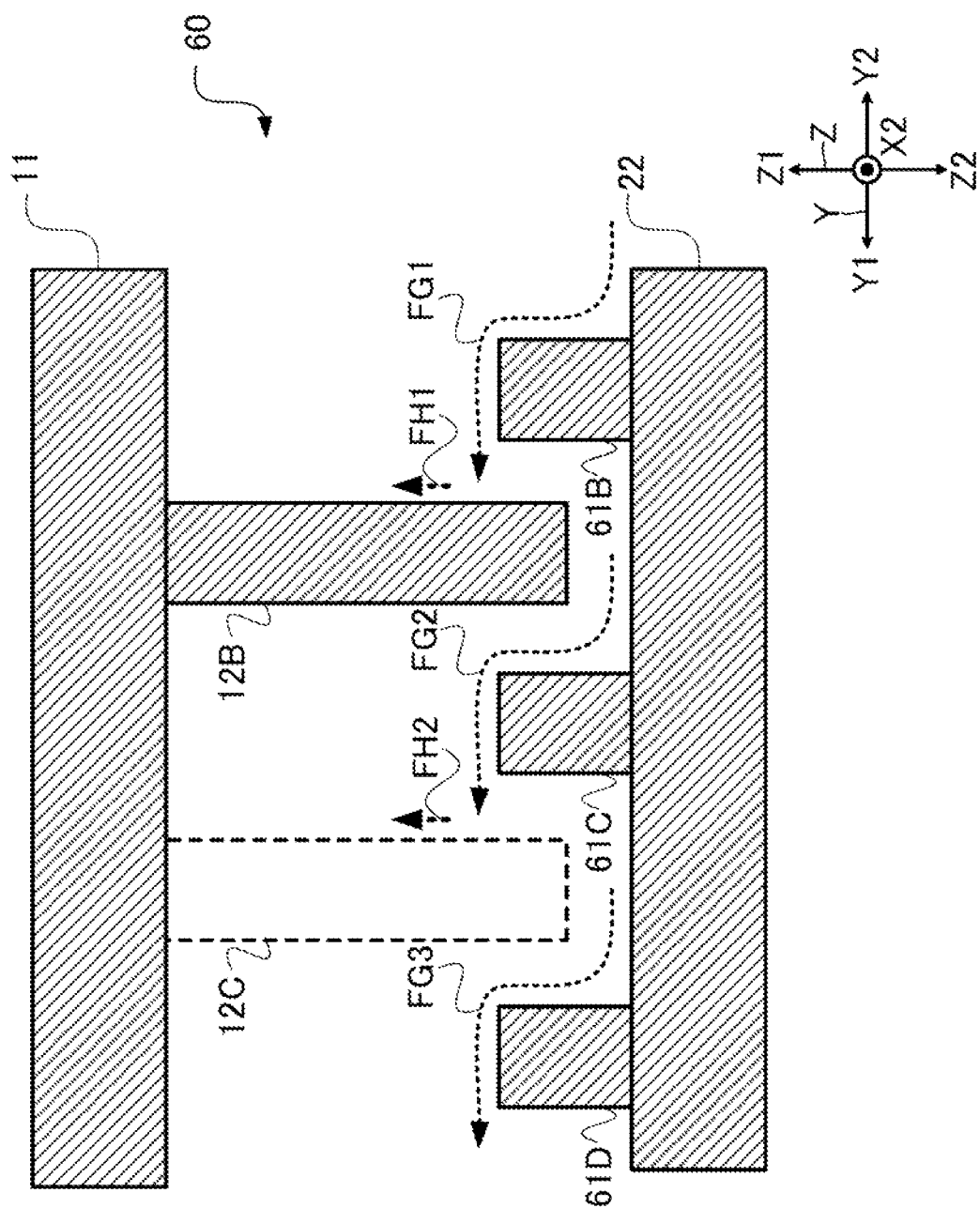
FIG. 8 is a diagram illustrating flow of a refrigerant in a cross section of a cooling apparatus 60 according to another comparative example.

FIG. 8 is a diagram illustrating a flow of a refrigerant in a cooling apparatus 60 that is a second comparative example. For components in common with the cooling apparatus 1 and the cooling apparatus 60, the same sign is used and explanations of their functions are omitted. In FIG. 8, each of the arrows shows flow of the refrigerant.

The cooling apparatus 60 differs from the cooling apparatus 1 in that the cooling apparatus 60 includes protrusions 61A to 61F with a rectangular cross section perpendicular to the X-axis instead of the protrusions 21A to 21F with the right triangular cross section perpendicular to the X-axis. Specifically, a shape of each of the cross sections, which is perpendicular to the X-axis, of the protrusions 61A to 61F is a rectangular shape having two sides parallel to the Y-axis direction and two sides parallel to the Z-axis direction.

As illustrated by arrow "FG1" in FIG. 8, when the refrigerant flowing in the Y1 direction comes into contact with the protrusion 61B, the refrigerant moves in the Z1 direction along a surface, which is perpendicular to the X-axis, included in the protrusion 61B, and then the refrigerant changes a direction of movement of the refrigerant to the Y1 direction at a corner of the surface, which is perpendicular to the X-axis, included in the protrusion 61B. In other words, the refrigerant flowing in the vicinity of the protrusion 61B comes into contact with the pin fin 12B without being directed in the Z1 direction. Therefore, as will be understood from a comparison of the flow indicated by arrow "FH1" in FIG. 8 with the flow indicated by arrow "FB1" in FIG. 6, flow velocity of the refrigerant in contact with the pin fin 12B as illustrated in FIG. 8 is slow compared to that in the cooling apparatus 1. A flow rate of the refrigerant in contact with the pin fin 12B in the cooling apparatus 60 is small compared to that in the cooling apparatus 1.

Some of the refrigerant flowing in the Y1 direction moves in the Z2 direction along both a back surface of the protrusion 61B and the pin fin 12B. As illustrated by arrow "FG2" in FIG. 8, when the refrigerant, which has passed through a gap between the pin fin 12B and the facing surface 24, comes into contact with the protrusion 61C, the refrigerant moves in the Z1 direction along a surface, which is perpendicular to the X-axis, included in the protrusion 61C. Thereafter, the refrigerant moving in the Z1 direction changes the direction of movement of the refrigerant to the Y1 direction at a corner of the surface, which is perpendicular to the X-axis, included in the protrusion 61C. In other words, the refrigerant flowing in the vicinity of the protrusion 61C comes into contact with the pin fin 12C without being directed in the Z1 direction. Therefore, as will be understood from a comparison of the flow indicated by arrow "FH2" in FIG. 8 with the flow indicated by arrow "FB2" in FIG. 6, flow velocity of the refrigerant in contact with the pin fin 12C as illustrated in FIG. 8 is slow compared to that in the cooling apparatus 1. A flow rate of the refrigerant in contact with the pin fin 12C in the cooling apparatus 60 is low compared to that of the cooling apparatus 1.

Similarly, as illustrated by arrow "FG3" in FIG. 8, when the refrigerant, which has passed through a gap between the pin fin 12C and the facing surface 24, comes into contact with the protrusion 61D, the refrigerant moves in the Z1 direction along a surface, which is perpendicular to the X-axis, included in the protrusion 61D. Thereafter, the refrigerant moving in the Z1 direction changes direction of movement of the refrigerant to the Y1 direction at a corner of the surface, which is perpendicular to the X-axis, included in the protrusion 61D.

Therefore, in the cooling apparatus 60, the refrigerant approaches the roots of the pin fins 12B and 12C. However, an amount of the refrigerant approaching the roots of the pin fins 12B and 12C is small compared to that in the cooling apparatus 1.

On the other hand, in the cooling apparatus 1, the surfaces of the protrusions 21A to 21F in contact with the refrigerant flowing in the flow direction Y1 are the slopes 25A to 25F inclined to the facing surface 24. Therefore, the amount of refrigerant approaching the roots of the pin fins 12B and 12C is large compared to that in the cooling apparatuses 50 and 60. Consequently, the cooling target in contact with the arranging surface 13 is cooled more efficiently.

1.2 Effects of First Embodiment

This embodiment includes the following effects.

The cooling apparatus 1 according to the embodiment includes the heat radiating plate 10 including the arranging surface 13 in contact with the cooling target, the heat radiating surface 14 opposite to the arranging surface 13, and the pin fins 12 protruding from the heat radiating surface 14. The cooling apparatus 1 further includes the water jacket 20 including the facing surface 24 facing the heat radiating surface 14. The refrigerant flows between the heat radiating plate 10 and the water jacket 20. The water jacket 20 includes a protrusion 21 protruding from the facing surface 24 toward the space between the pin fins 12 in the flow direction of the refrigerant. The protrusion 21 includes the slope 25 inclined to the facing surface 24. The slope 25 includes the tip 26 and the end 27. The tip 26 is closer to the heat radiating surface 14 than the end 27. The end 27 is closer to the facing surface 24 than the tip 26. The tip 26 is positioned downstream in the flow direction of the refrigerant from the end 27.

According to this configuration, the refrigerant passing near a tip of a pin fin 12 protruding from the heat radiating surface 14 approaches a root of another pin fin 12 due to the protrusion 21 protruding from the facing surface 24. Therefore, the cooling target in contact with the arranging surface 13 is cooled efficiently compared to a configuration without the protrusion 21.

In the cooling apparatus 1 according to the embodiment, the facing surface 24 may face the heat radiating surface 14 with the facing surface 24 apart from the tips 15 of the pin fins 12. The tips 26A to 26F of the protrusions 21A to 21F may be closer to the heat radiating surface 14 than the tips 15 of the pin fins 12.

According to this configuration, the protrusion 21 protruding from the facing surface 24 causes the refrigerant passing through the gap between the tip 15 of the pin fin 12 protruding from the heat radiating surface 14 and the facing surface 24 to flow toward a position shifted in the Z1 direction from the tip 15 of the pin fin 12. Therefore, the refrigerant approaches the root of another pin fin 12. Consequently, the cooling target in contact with the arranging surface 13 is cooled efficiently compared to a configuration in which the tips 26A to 26F of the protrusions 21A to 21F are closer to the facing surface 24 than the tips 15 of the pin fins 12.

In the cooling apparatus 1 according to the embodiment, the water jacket 20 may include the plurality of protrusions 21 arranged along the flow direction of the refrigerant.

According to this configuration, since the plurality of protrusions 21 are arranged along the flow direction, an amount of the refrigerant approaching the roots of the pin fins 12 increases. Therefore, the cooling target in contact with the arranging surface 13 is cooled more efficiently.

In the cooling apparatus 1 according to the embodiment, the protrusion 21F positioned downstream in the flow direction of the refrigerant from the protrusion 21A may be higher than the protrusion 21A positioned upstream in the flow direction of the refrigerant from the protrusion 21F.

In the cooling apparatus 1, the strength of flow of the refrigerant toward the heat radiating surface 14 after the refrigerant passes near the protrusion 21 is weaker as the refrigerant is closer to a position located downstream in the flow direction of the refrigerant. According to the above configuration, the protrusion 21 is higher as the protrusion 21 is closer to the position located downstream in the flow direction. Therefore, it is possible to reduce a difference between degrees to which the refrigerant approaches the roots of the pin fins 12 in the range from the upstream side in the flow direction Y1 of the refrigerant to the downstream side in the flow direction Y1 of the refrigerant.

In the cooling apparatus 1 according to the embodiment, the slope angle of the slope 25F of the protrusion 21F positioned downstream in the flow direction of the refrigerant may be greater than that of the slope 25A of the protrusion 21A positioned upstream in the flow direction of the refrigerant.

In the cooling apparatus 1, the flow of the refrigerant toward the heat radiating surface 14 after the refrigerant passes near the protrusion 21 decreases as the refrigerant approaches the position located downstream in the flow direction of the refrigerant. According to the above configuration, the slope angle of the slope 25 of the protrusion 21 is steeper as the protrusion 21 is closer to the position located downstream in the flow direction of the refrigerant. Therefore, it is possible to reduce the difference between degrees to which the refrigerant approaches the roots of the pin fins 12 in the range from the upstream side in the flow direction Y1 of the refrigerant to the downstream side in the flow direction Y1 of the refrigerant.

In the cooling apparatus 1 according to the embodiment, the protrusions 21 may extend between the pin fins 12 in the direction intersecting the flow direction of the refrigerant.

According to this configuration, since the protrusion 21 extends between the pin fins 12 in the direction intersecting the flow direction of the refrigerant, when viewed from the flow direction of the refrigerant, it is possible to cause the refrigerant flowing between pin fins 12 to approach the root of another pin fin 12.

In the cooling apparatus 1 according to the embodiment, an arrangement of the pin fins 12 on the heat radiating surface 14 may be staggered.

According to this configuration, when viewed from the flow direction of the refrigerant, the refrigerant flowing and passing between the pin fins 12 comes into contact with a front surface of another pin fin 12 immediately, compared to a configuration in which an arrangement of the pin fins 12 on the second surface is in a grid pattern. This increases the flow resistance of the refrigerant. This makes it possible to radiate more heat from the pin fins 12.

In the cooling apparatus 1 of the embodiment, the back surface 28 of the protrusion 21 may be in contact with the pin fin 12.

According to this configuration, a distance of the slope 25 of the protrusion 21, on which the refrigerant having passed through the vicinity of the tip 15 of the pin fin 12 flows until the refrigerant impacts the next pin fin 12, becomes longer. This increases the amount of the refrigerant approaching the roots of the pin fins 12. Therefore, the cooling target in contact with the arranging surface 13 is cooled more efficiently.

In the cooling apparatus 1 according to the embodiment, the protrusions 21 may each be made of a porous member.

According to this configuration, the protrusions 21 are each made of a porous member. This expands an area of contact between the protrusions 21 and the refrigerant, and disturbs the flow of the refrigerant in the vicinity of the protrusions 21. Therefore, the refrigerant comes into contact with the pin fins 12 from various directions. Consequently, it is possible for the pin fin 12 to radiate more heat.

2. Second Embodiment

A cooling apparatus according to a second embodiment will be described below with reference to FIG. 9.

2.1 Configuration of Second Embodiment

Figure 9:
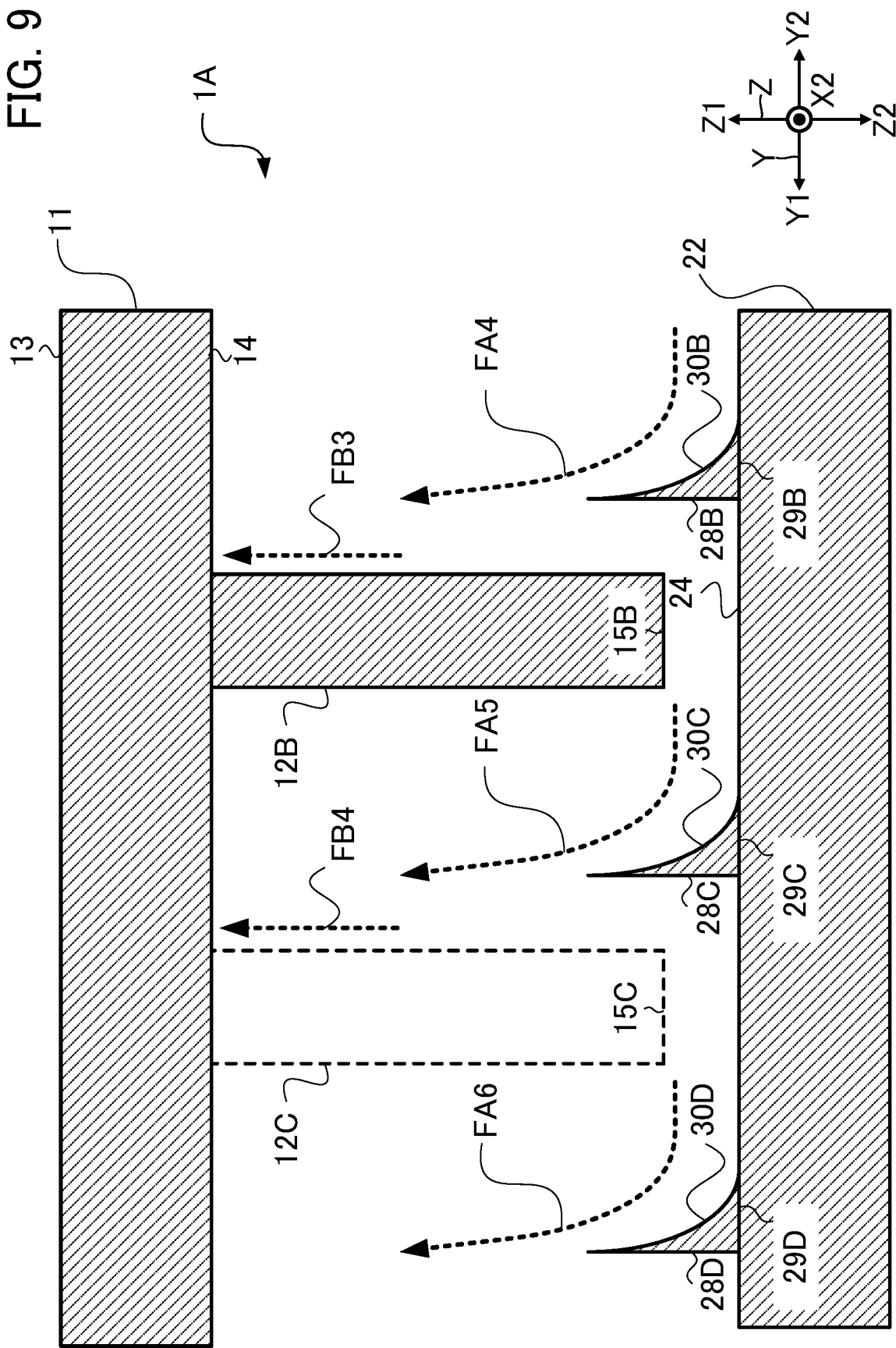
FIG. 9 is a diagram illustrating flow of a refrigerant in a cross section of a cooling apparatus 1A according to another embodiment of the disclosure.

FIG. 9 is a cross sectional view of a cooling apparatus 1A according to the second embodiment. FIG. 9 relates to FIG. 6. To simplify explanation, for components in common with the cooling apparatus 1 according to the first embodiment and the cooling apparatus 1A according to the second embodiment, the same signs are used and explanations of their functions are omitted. In the following, the points in which the cooling apparatus 1A according to the second embodiment differs from the cooling apparatus 1 according to the first embodiment will be mainly described.

The cooling apparatus 1A differs from the cooling apparatus 1 in that the cooling apparatus 1A includes protrusions 29A to 29F instead of the protrusions 21A to 21F. In the protrusions 21A to 21F, the slopes 25A to 25F are each planar. The protrusions 29A to 29F are different from the protrusions 21A to 21F in that the protrusions 29A to 29F include curved slopes 30A to 30F respectively.

Specifically, the gradient of each of the slopes 30A to 30F to the facing surface 24 becomes steeper in the flow direction of the refrigerant. The slope 30 includes a first end and a second end. The first end and the second end of the slope 30 are both ends of the slope 30. The first end of the slope 30 is closest to the heat radiating surface 14 in the slope 30. The first end of the slope 30 is positioned downstream in the flow direction of the refrigerant from the second end of the slope 30. The slope 30 increases from the first end of the slope 30 toward the second end of the slope 30. The slope 30 increases from the second end of the slope 30 toward the first end of the slope 30. The slope 30 includes a first partial surface, and a second partial surface that is closer to the second end than the first partial surface. The gradient of the first partial surface is greater than the gradient of the second partial surface.

As illustrated by arrow "FA4" in FIG. 9, when the refrigerant flowing in the Y1 direction comes into the slope 30B of the protrusion 29B, the refrigerant moves along the slope 30B. Thereafter, when the refrigerant comes into contact with the pin fin 12B, the refrigerant flows along the pin fin 12B in the Z1 direction, as illustrated by arrow "FB3" in FIG. 9.

In the cooling apparatus 1A according to the second embodiment, as the refrigerant moves along the slope 30B of the protrusion 29B, an angle of a movement direction of the refrigerant to the facing surface 24 becomes steeper. Therefore, the flow of the refrigerant illustrated by arrow "FA4" is directed in the Z1 direction strongly compared to the first embodiment. Therefore, as will be understood from a comparison of the flow indicated by arrow "FB3" in FIG. 9, with the flow indicated by arrow "FB1" in FIG. 6, flow velocity of the refrigerant in contact with the pin fin 12B as illustrated in FIG. 9, is high compared to that of the first embodiment. A flow rate of the refrigerant in contact with the pin fin 12B in the cooling apparatus 60 is high compared to that in the first embodiment.

Some of the refrigerant flowing in the FA4 direction moves in the Z2 direction along both a back surface 28B of the protrusion 29B and the pin fin 12B, and then passes through a gap between the pin fin 12B and the facing surface 24 in the Y1 direction. As illustrated by arrow "FA5" in FIG. 9, when the refrigerant, which has passed through the gap between the pin fin 12B and the facing surface 24, comes into contact with the slope 30C of the protrusion 29C, the refrigerant moves along the slope 30C. Thereafter, when the refrigerant comes into contact with the pin fin 12C, the refrigerant flows along the pin fin 12C in the Z1 direction as illustrated by arrow "FB4" in FIG. 9.

Similar to a case in which the refrigerant moves along the slope 30B of the protrusion 29B, as the refrigerant moves along the slope 30C of the protrusion 29C, an angle of a movement direction of the refrigerant to the facing surface 24 becomes steeper. Therefore, the flow of the refrigerant illustrated by arrow "FA5" is directed in the Z1 direction strongly compared to the first embodiment. Therefore, as will be understood from a comparison of the flow indicated by arrow "FB4" in FIG. 9 with the flow indicated by arrow "FB2" in FIG. 6, a flow rate of the refrigerant in contact with the pin fin 12C as illustrated in FIG. 9 is high compared to that of the first embodiment.

Some of the refrigerant flowing in the FA5 direction moves in the Z2 direction along both a back surface 28C of the protrusion 29C and the pin fin 12C, and then passes through a gap between the pin fin 12C and the facing surface 24 in the Y1 direction. As illustrated by arrow "FA6" in FIG. 9, when the refrigerant, which has passed through the gap between the pin fin 12C and the facing surface 24, comes into contact with the slope 30D of the protrusion 29D, the refrigerant moves along the slope 30D.

Therefore, compared to the cooling apparatus 1 according to the first embodiment, the refrigerant approaches the roots of the pin fins 12B and 12C more closely.

2.2 Effects of Second Embodiment

This embodiment includes the following effects.

In the cooling apparatus 1A according to this embodiment, the slopes 30A to 30F include curved surfaces, and in particular, the gradient of each of the slopes 30A to 30F becomes steeper in the flow direction of the refrigerant. In other words, the gradient of the slope 30 increases from the second end of the slope 30 toward the first end of the slope 30.

According to this configuration, a degree increases to which the refrigerant approaches the roots of the pin fins 12 protruding from the heat radiating surface 14, compared to the cooling apparatus 1 according to the first embodiment. Therefore, the cooling target in contact with the arranging surface 13 is cooled more efficiently.

The gradient of each of the slopes 30A to 30F becomes more gradual in a direction opposite to the flow direction of the refrigerant. In other words, the gradient of the slope 30 decreases from the first end of the slope 30 toward the second end of the slope 30.

This configuration results in a smaller pressure drop between an inlet of the cooling apparatus 1A for the refrigerant and an outlet of the cooling apparatus 1A for the refrigerant, compared to the cooling apparatus 1 according to the first embodiment in which the gradient of the slope is steep from the upstream side of the refrigerant.

3. Third Embodiment

A cooling apparatus according to a third embodiment will be described below with reference to FIG. 10.

3.1 Configuration of Third Embodiment

Figure 10:
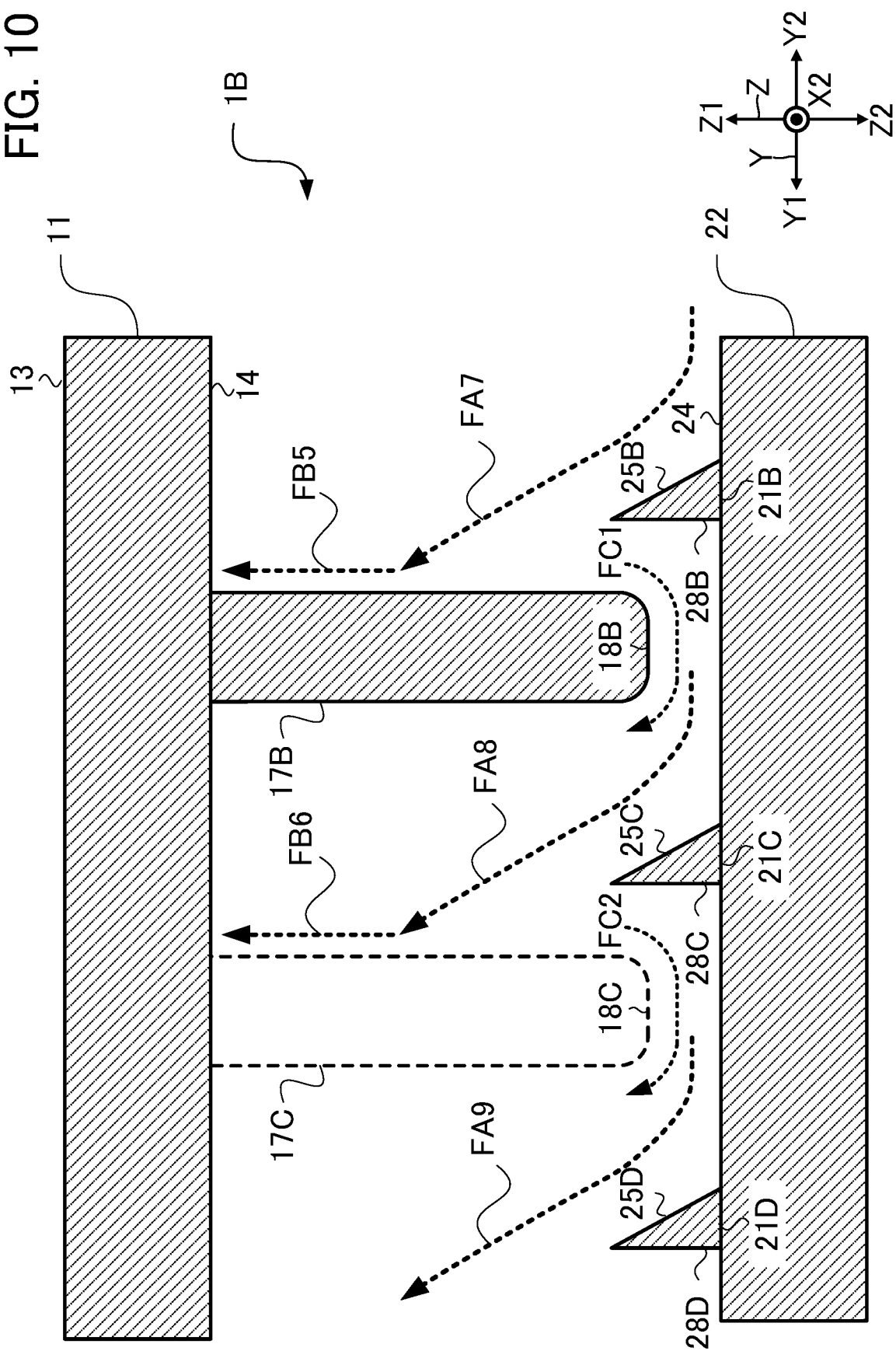
FIG. 10 is a diagram illustrating flow of a refrigerant in a cross section of a cooling apparatus 1B according to yet another embodiment of the disclosure.

FIG. 10 is a cross sectional view of a cooling apparatus 1B according to the third embodiment. FIG. 10 relates to FIG. 6. To simplify explanation, for components in common with the cooling apparatus 1 according to the first embodiment and the cooling apparatus 1B according to the third embodiment, the same reference signs are used, and explanations of their functions are omitted. In the following, the points in which the cooling apparatus 1B according to the third embodiment differs from the cooling apparatus 1 according to the first embodiment will be mainly described.

The cooling apparatus 1B differs from the cooling apparatus 1 in that the cooling apparatus 1B includes pin fins 17 instead of the pin fins 12. Each pin fin 17 includes a tip 18 instead of the tip 15 of each pin fin 12. Each tip 18 is an example of a "tip end." Each tip 18 includes a first corner and a second corner. The first corner and the second corner of each tip 18 are both ends of each tip 18. The first corner is positioned upstream in the flow direction Y1 from the second corner. The second corner in positioned downstream in the flow direction Y1 from the first corner. The first corner or the second corner is a rounded corner.

As illustrated in FIG. 10, each tip 18 differs from each tip 15 in that at least the corner (the second corner) positioned downstream in the flow direction of the refrigerant is R-shaped. An "R-shape" refers to a shape of the tip 18 in which a side surface of the tip 18 and a bottom surface of the tip 18 are coupled to each other with a curved surface. In the cross sectional view illustrated in FIG. 10, the side surface and the bottom surface are continuous with each other in an arc shape.

FIG. 10 illustrates the tip 18 with an R-shaped corner formed on an entire circumference of a circle joining the side surface of the tip 18 with the bottom surface of the tip 18, in addition to the R-shaped corner positioned downstream in the refrigerant.

As illustrated by arrow "FA7" in FIG. 10, when the refrigerant flowing in the Y1 direction comes into contact with the slope 25B of the protrusion 21B, the refrigerant moves along the slope 25B. Thereafter, when the refrigerant comes into contact with the pin fin 17B, as illustrated by arrow "FB5" in FIG. 10, the refrigerant flows along the pin fin 17B in the Z1 direction.

Some of the refrigerant that rises along the slope 25B moves in the Z2 direction along both the back surface 28B of the protrusion 21B and the pin fin 17B, and then passes through a gap between the pin fin 17B and the facing surface 24 in the Y1 direction.

Of the refrigerant that flows through the gap between the pin fin 17B and the facing surface 24 in the Y1 direction, the refrigerant flowing near the pin fin 17B flows along the tip 18B of the pin fin 17B due to a "Coanda effect" in which a viscous fluid flows along a wall that makes up a flow path. Therefore, as illustrated by arrow "FC1" in FIG. 10, the refrigerant flowing near the pin fin 17B is directed in the Z1 direction by passing through a vicinity of the tip 18B.

The refrigerant is viscous. Therefore, of the refrigerant that flows through the gap between the pin fin 17B and the facing surface 24 in the Y1 direction, the refrigerant flowing near the facing surface 24 is also directed in the Z1 direction as the refrigerant flowing near the pin fin 17B is directed in the Z1 direction. In other words, the refrigerant flowing near the facing surface 24 is directed in the Z1 direction by the flow of the refrigerant indicated by arrow "FC1." Therefore, the flow of the refrigerant illustrated by arrow "FA8" is directed in the Z1 direction strongly compared to the first embodiment. Therefore, as will be understood from a comparison of the flow indicated by arrow "FB6" in FIG. 10 with the flow indicated by arrow "FB2" in FIG. 6, flow velocity of the refrigerant in contact with the pin fin 17C as illustrated in FIG. 10 is high compared to that of the first embodiment. A flow rate of the refrigerant in contact with the pin fin 17C in the cooling apparatus 1B is high compared to that of the first embodiment.

Some of the refrigerant flowing in the FA8 direction moves in the Z2 direction along both the back surface 28C of the protrusion 21C and the pin fin 17C, and then passes through a gap between the pin fin 17C and the facing surface 24 in the Y1 direction.

Of the refrigerant that flows through the gap between the pin fin 17C and the facing surface 24 in the Y1 direction, the refrigerant flowing near the pin fin 17C flows along the tip 18C of the pin fin 17C due to the "Coanda effect", as well as the flow of the refrigerant indicated by arrow "FC1." Therefore, as illustrated by arrow "FC2" in FIG. 10, the refrigerant flowing near the pin fin 17C is directed in the Z1 direction by passing through a vicinity of the tip 18C.

Of the refrigerant flowing through the gap between the pin fin 17C and the facing surface 24 in the Y1 direction, the refrigerant flowing near the facing surface 24 is also directed in the Z1 direction by the flow of the refrigerant indicated by arrow "FC2". Therefore, the flow of the refrigerant illustrated by arrow "FA9" is strongly directed in the Z1 direction compared to that of the first embodiment.

A configuration in which the tip 18 has the R-shaped corner positioned downstream in the refrigerant, and a configuration in which the tip 18 has the R-shaped corner formed on the entire circumference of the circle joining the side surface of the tip 18 and the bottom surface of the tip 18 are described. However, the cooling apparatus 1B according to the third embodiment is not limited to each configuration. For example, only a corner positioned upstream in the refrigerant (the first corner) may be an R-shaped corner. In this case, the refrigerant is directed both toward the gap between the pin fin 17B and the facing surface 24 and toward the gap between the pin fin 17C and the facing surface 24. Therefore, it is possible to direct collisions of the refrigerant with the protrusions 21C and 21D. Consequently, compared to the first embodiment, the flows of the refrigerant illustrated in "FA8" and "FA9" and the flow of the refrigerant illustrated in "FB6" are strongly directed in the Z1 direction

3.2 Effects of Third Embodiment

This embodiment includes the following effects.

In the cooling apparatus 1B according to this embodiment, the tip 18 of the pin fin 17 includes the R-shaped corner positioned downstream in the flow direction of the refrigerant.

The Coanda effect causes the refrigerant to flow along the tip 18 of the pin fin 17 protruding from the heat radiating surface 14. According to the above configuration, the tip 18 of the pin fin 17 includes the R-shaped corner positioned downstream in the flow direction of the refrigerant. Therefore, the refrigerant flowing through the vicinity of the tip 18 of the pin fin 17 approaches the roots of the pin fins 17 still closer compared to the cooling apparatus 1 according to the first embodiment in which the tip 15 of the pin fin 12 does not include the R-shaped corner positioned downstream in the flow direction of the refrigerant. Consequently, the cooling target in contact with the arranging surface 13 is cooled more efficiently.

4. Modifications

The disclosure is not limited to the embodiments described above. Specific modifications will be described below.

4.1 Modification 1

For example, the height of the protrusion 21 may decrease from the center of the protrusion 21 in the X-axis direction intersecting the Y1 direction, which is the flow direction of the refrigerant, to both ends of the protrusion 21 in the X-axis direction. This is because the supply pipe 71 and the drain pipe 72 are arranged at the center of the cooling apparatus in the X-axis direction.

FIG. 11 is an example of a cross sectional view of a cooling apparatus 1C according to this modification when viewed from the Y1 direction. In the cooling apparatus 1C, a plurality of pin fins 12G to 12J protrudes in the Z2 direction from the first base plate 11. As illustrated in FIG. 11, the plurality of pin fins 12G to 12J are arranged at equal intervals in the X1 direction in order of sign. Although four pin fins 12G to 12J are illustrated in FIG. 11, the number of pin fins 12 may be freely selected. In FIG. 11, the positions of the pin fins 12G to 12J are shifted in the Y1 direction from the position of a protrusion 31. Therefore, the pin fins 12G to 12J are represented by dotted lines.

In the cooling apparatus 1C, the protrusion 31 protrudes from the facing surface 24 of the second base plate 22. The protrusion 31 extends in the X-axis direction.

FIG. 11 illustrates positions C1a to C3a in the X-axis direction. The position C1a is a position of a midpoint in a width (X-axis direction) of the flow path inside the cooling apparatus 1C. The position C3a is a position of a vicinity of the end of the width of the flow path inside the cooling apparatus 1C (specifically, a position shifted from the position C1a in the X2 direction). The position C2a is a position between the position C1a and the position C3a in the X-axis direction.

The height of the protrusion 31, that is, the length of the protrusion 31 in the Z-axis direction, is highest at the position C1a in the X-axis direction. The height of the protrusion 31 gradually decreases from the position C1a to the ends of the protrusion 31 in the X-axis direction.

In the example illustrated in FIG. 11, the height d3 of the protrusion 31 at the position C1a is greater than the height d4 of the protrusion 31 at the position C2a, and the height d4 of the protrusion 31 at the position C2a is greater than the height d5 of the protrusion 31 at the position C3a (d3>d4>d5).

The height of the protrusion 31 gradually decreases from the position C1a to the ends of the protrusion 31. The relationship between a distance from the position C1a and a decrease in the height of the protrusion 31 may or may not be a proportional relationship. For example, a portion of the upper edge of the protrusion 31 may be horizontal.

Flow velocity of the refrigerant at both ends of the flow path in the X-axis direction is slower than flow velocity of the refrigerant at the center of the flow path in the X-axis direction intersecting the flow path direction (the flow direction of the refrigerant). This modification includes a configuration in which the height of the protrusion 31 decreases from the center of the protrusion 31 in the X-axis direction to both the ends of the protrusion 31 in the X-axis direction. Therefore, it is possible to reduce a difference between the flow velocities of the refrigerant in the cooling apparatus 1C in the X-axis direction intersecting the flow path direction.

A configuration is described in which, in the X-axis direction intersecting the Y1 direction that is the flow path direction of the refrigerant, the height of the protrusion 31 decreases from the center of the protrusion 31 to both ends of the protrusion 31. However, the cooling apparatus 1C according to this modification is not limited to the configuration. For example, a first portion of the protrusion 31 may be freely selected in the X-axis direction based on the positions of the supply pipe 71 and the drain pipe 72, and a height of the first portion of the protrusion 31 may be greater than a height of the other portion of the protrusion 31.

4.2 Modification 2

In the cooling apparatus 1 according to the first embodiment, the semiconductor modules 50A to 50C, which are each an example of the cooling target, are cooled. However, the cooling target is not limited to the semiconductor module. For example, semiconductor elements may be cooled instead of the semiconductor modules 50A to 50C. In addition, an element other than semiconductor components (semiconductor modules or semiconductor elements) may be cooled as the cooling target.

4.3 Modification 3

Although the semiconductor apparatus 5 according to the first embodiment includes the cooling apparatus 1, embodiments according to the disclosure are not limited to this aspect. For example, the semiconductor apparatus 5 may include the cooling apparatus 1A according to the second embodiment or the cooling apparatus 1B according to the third embodiment instead of the cooling apparatus 1.

DESCRIPTION OF REFERENCE SIGNS 1, 1A, 1B, 1C ... cooling apparatus, 10 ... heat radiating plate, 11 ... first base plate, 12, 12A, 12B, 12C, 12D, 12F ... pin fin, 13 ... arranging surface, 14 ... heat radiating surface, 15, 15A, 15F ... tip, 16 ... end, 17, 17B, 17C ... pin fin, 18, 18B, 18C ... tip, 20 ... water jacket, 21, 21A, 21B, 21C, 21D, 21F ... protrusion, 22 ... second base plate, 24 ... facing surface, 25, 25A, 25B, 25C, 25F ... slope, 26A, 26F ... tip, 27A, 27F ... end, 28, 28A, 28B, 28C, 28D, 28F ... back surface, 29A, 29B, 29C, 29D ... protrusion, 30A, 30B, 30C, 30D, 30F ... slope, 31 ... protrusion, 40, 40A, 40C ... region, 50, 60 ... cooling apparatus, 61A, 61B, 61C, 61D, 61F ... protrusion, 71 ... supply pipe, 72 ... drain pipe.

What is claimed is:

1. A cooling apparatus comprising:
a first member including a first surface in contact with a cooling target, a second surface opposite to the first surface, and a plurality of radiating fins protruding from the second surface; and
a second member including a third surface facing the second surface, wherein:
a refrigerant flows between the first member and the second member,
the second member includes a first protrusion protruding from the third surface toward a space, the space existing between the radiating fins in a flow direction of the refrigerant,
the first protrusion includes a first slope inclined to the third surface,
the first slope includes a first end and a second end,
the first end is closer to the second surface than the second end,
the second end is closer to the third surface than the first end,
the first end is positioned downstream in the flow direction from the second end,
the first slope includes a first partial surface and a second partial surface that is closer to the second end than the first partial surface and that faces the second surface, and
an absolute value of a gradient of the first partial surface from the third surface is greater than an absolute value of a gradient of the second partial surface from the third surface.

2. The cooling apparatus according to claim 1, wherein:
the third surface faces the second surface with the third surface apart from a tip of each of the radiating fins, and
the first protrusion includes a tip closer to the second surface than the tip of each of the radiating fins.

3. The cooling apparatus according to claim 1, wherein:
each of the radiating fins includes a tip end facing the third surface,
the tip end includes a first corner and a second corner, which are both ends of the tip end in the flow direction, and
at least one of the first corner or the second corner is rounded.

4. The cooling apparatus according to claim 1, wherein:
the second member includes a plurality of protrusions arranged in the flow direction on the third surface, and
the plurality of protrusions includes the first protrusion.

5. The cooling apparatus according to claim 4, wherein:
the plurality of protrusions further includes a second protrusion positioned upstream in the flow direction from the first protrusion.

6. The cooling apparatus according to claim 4, wherein:
the plurality of protrusions further includes a second protrusion positioned upstream in the flow direction from the first protrusion,
the second protrusion includes a second slope inclined to the third surface,
the second slope includes a third end and a fourth end,
the third end is closer to the second surface than the fourth end,
the fourth end is closer to the third surface than the third end, and
the third end is positioned downstream in the flow direction from the fourth end.

7. The cooling apparatus according to claim 1, wherein the first protrusion extends in a direction intersecting the flow direction in the space between the radiating fins.

8. The cooling apparatus according to in claim 7, wherein a height of the first protrusion is not constant in the direction intersecting the flow direction.

9. The cooling apparatus according to claim 1, wherein the radiating fins are staggered on the second surface.

10. The cooling apparatus according to claim 1, wherein:
the first protrusion includes a first portion and a second portion, which are both ends of the first protrusion in the flow direction, and
the first portion is positioned downstream in the flow direction from the second portion.

11. A semiconductor apparatus comprising a cooling apparatus, wherein:
the cooling apparatus includes:
a first member including a first surface in contact with a cooling target, a second surface opposite to the first surface, and a plurality of radiating fins protruding from the second surface; and
a second member including a third surface facing the second surface, wherein:
a refrigerant flows between the first member and the second member,
the second member includes a protrusion protruding from the third surface toward a space, the space existing between the radiating fins in a flow direction of the refrigerant,
the protrusion includes a slope inclined to the third surface,
the slope includes a first end and a second end,
the first end is closer to the second surface than the second end,
the second end is closer to the third surface than the first end,
the first end is positioned downstream in the flow direction from the second end,
the slope includes a first partial surface and a second partial surface that is closer to the second end than the first partial surface and that faces the second surface, and
an absolute value of a gradient of the first partial surface from the third surface is greater than an absolute value of a gradient of the second partial surface from the third surface.

* * * * *